United States Patent [19]

Terasawa

[11] Patent Number: 5,604,674
[45] Date of Patent: Feb. 18, 1997

[54] DRIVING CIRCUIT MODULE

[75] Inventor: Noriho Terasawa, Nagano, Japan

[73] Assignee: Fuji Electric Co., Ltd., Japan

[21] Appl. No.: 511,330

[22] Filed: Aug. 7, 1995

[30] Foreign Application Priority Data

Aug. 10, 1994 [JP] Japan .................................. 6-187976

[51] Int. Cl.$^6$ .................................................. H02M 1/00
[52] U.S. Cl. .................................... 363/147; 363/132
[58] Field of Search ................................. 363/132, 146, 363/147

[56] References Cited

U.S. PATENT DOCUMENTS

| | | | |
|---|---|---|---|
| 4,862,344 | 8/1989 | Emoto | 363/147 |
| 5,170,337 | 12/1992 | Borowiec et al. | 363/147 |
| 5,313,150 | 5/1994 | Arakawa et al. | 363/147 |
| 5,412,558 | 5/1995 | Sakurai et al. | 363/147 |

*Primary Examiner*—Stuart N. Hecker
*Attorney, Agent, or Firm*—Rossi & Associates

[57] ABSTRACT

To suppress the increase of the cost and dimensions of an intelligent module which incorporates a control function with the driving circuit device having a bridge circuit for driving inverters etc. The module 70 has a rectangular base plate 30, along the long side of which are aligned power semiconductor elements 10. Chips of control input circuits 20 are displaced along the short side of the base plate 30, and arranged in close proximity to the corresponding semiconductor elements. Input terminals P, N and output terminals U, V, W are arranged on the long side of the base plate 30 along which the semiconductor elements 10 are arranged. Control input terminals Tc are arranged on another long side of the base plate 30. The input and output terminals are connected via conductors 40 with the corresponding semiconductor elements 10. And, the control input terminals Tc are connected via a wiring board 50 with the corresponding control input circuits 20.

14 Claims, 3 Drawing Sheets

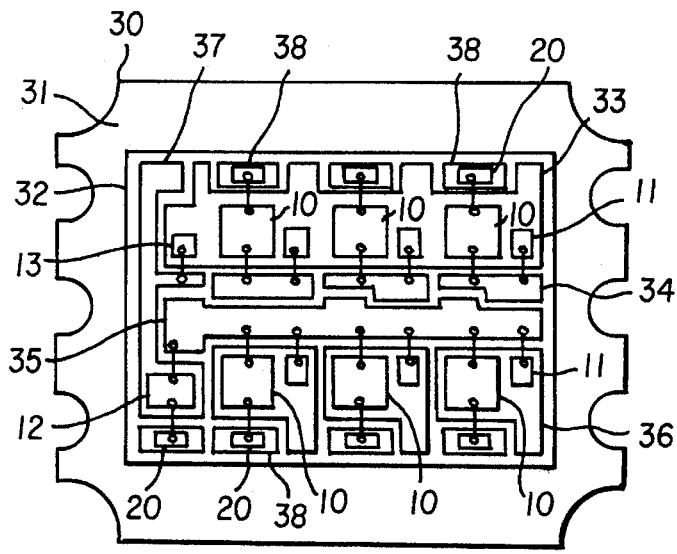
FIG. 2(a)
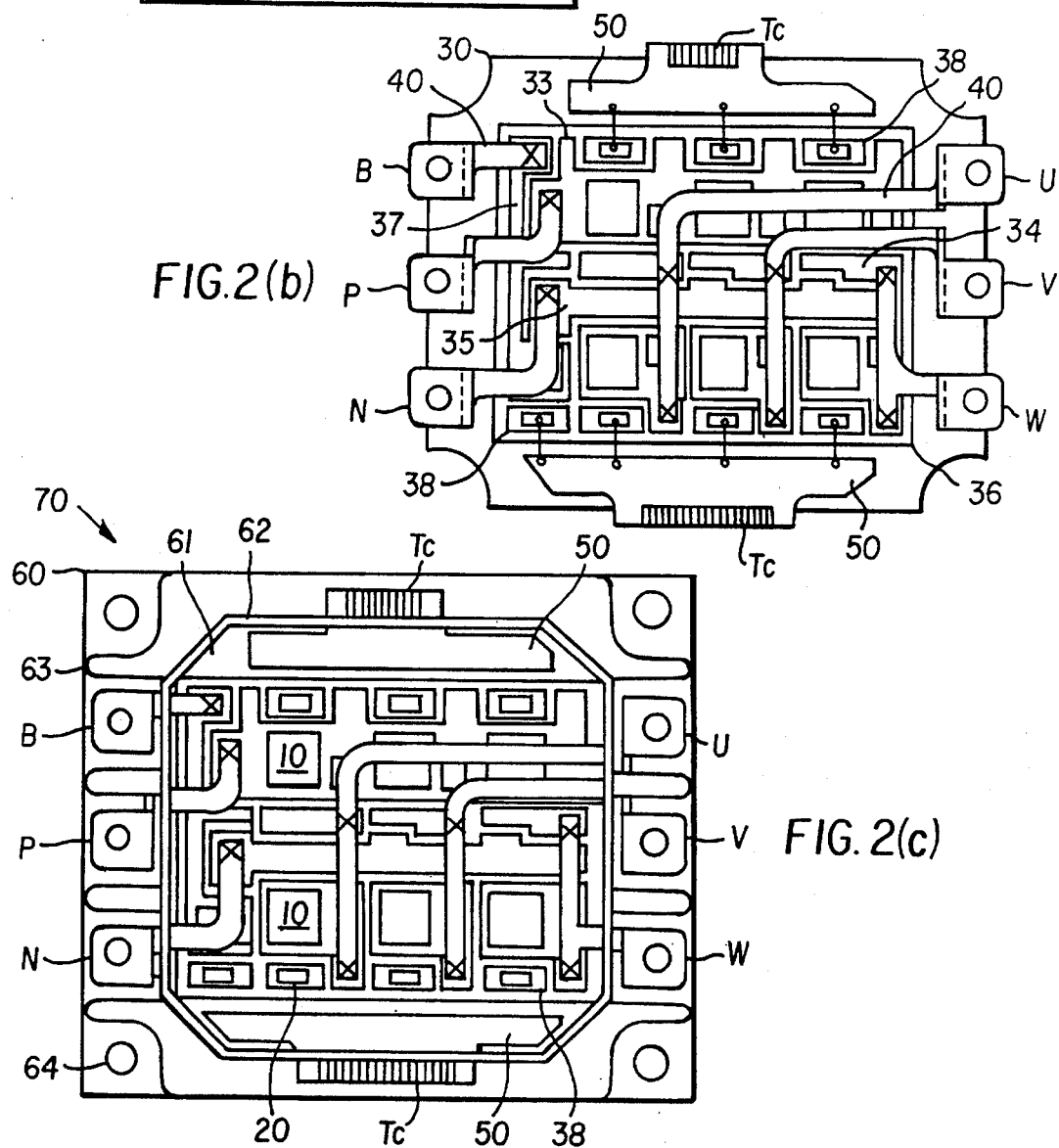
FIG.2(b)
FIG. 2(c)

DRIVING CIRCUIT MODULE

BACKGROUND OF THE INVENTION

The present invention relates to driving circuit modules as unit devices, which have a main circuit including a plurality of power semiconductor elements connected in a bridge circuit, for driving inverters etc.

Power converting apparatuses such as inverters etc. are widely used for driving motors etc. Usually, the driving circuit devices for driving power converting apparatuses are constructed as three-phase or two-phase bridge circuits which comprise semiconductor power elements such as insulated gate bipolar transistors, bipolar transistors, field effect transistors, etc. In practice, it is quite convenient to unitarily incorporate the semiconductor power elements with related elements such as free wheeling diodes etc. into a module. The semiconductor elements as the module constituents may be individual elements mounted individually inside a package. However, it is far more effective for reducing size and cost of the driving circuit modules to mount as made constituent semiconductor element chips on a base of the module, and then, mount the base in a package case to form a whole driving circuit module.

The conventional driving circuit modules have a metal base plate made of Cu, for example, which has high thermal conductivity. Necessary numbers of electrode plates made of Cu, for example, are held on the metal base plate through insulator plate made of ceramic materials which have high thermal resistance. Chips of the constituent elements such as transistors, annexed diodes, etc., the constituents of the module, are mounted on and bonded with the electrode plates. Output and input terminals are connected with the electrode plates through conductors. The thus assembled driving circuit device is covered with or fitted to a molded resin case. A resin is injected into the space between the case and the base plate, and hardened to form a solid unitary module. As is well known, the driving circuit modules are used with their base plate fixed to an Al radiator in tight thermal contact, and with their case mounted on an inverter etc.

It is necessary for using the driving circuit modules in various applications to incorporate a control circuit with the driving circuit module and to command detailed on-off operations to each semiconductor element constituting the bridge circuit corresponding to the application and the state of the load. Therefore, it has been required for simplifying the overall structure of the system including the control circuit to construct the driving circuit as an intelligent module which executes at least some functions which the control circuit does.

Since the control circuits may be electronic circuits which consume little electric power, the recent circuit integration techniques facilitate integrating the control circuits into a very small chip, though the control circuit may be complicated, and mounting the chip on a module. The most serious problem is that the control signal wiring is so complicated that it is necessary to lead out extra control signal lines for providing multi-purpose driving circuit modules.

The complexity of the wiring may be avoided by using wiring boards. But, the wiring board increases the size of the module to elongate the wiring length in the conventional module structures. The elongated wiring length increases the cost for compensating the wiring inductance by a capacitor or capacitors. Reduction of the space between the wiring conductors tends to cause mal-function by mutual interference of the control signals. Though the space may be reduced by using the base plate as the wiring board, it becomes very difficult to secure the withstand voltage between the high voltage power semiconductor elements and the control circuit.

SUMMARY OF THE INVENTION

In view of the foregoing, it is an object of the present invention to provide a driving circuit module, into which the control function is incorporated, and which facilitates shortening the internal wiring length of the control signal lines to suppress the increase of the size and cost of the module as much as possible.

The above object is achieved by a driving circuit module which comprises: a driving circuit device having a main circuit including power semiconductor elements connected in a bridge circuit connected between a pair of power supply points; control input circuits for controlling the respective semiconductor elements; a rectangular base plate; chips of the semiconductor elements aligned along the long side of the rectangular base plate; chips of the control input circuits aligned along the long side of the rectangular base plate and displaced along the short side of the rectangular base plate from the corresponding semiconductor elements; input and output terminals of the main circuit arranged on the side of the rectangular base plate, along which side the semiconductor elements are arranged, the input and output terminals being connected with the corresponding semiconductor elements via respective conductors; and control input terminals arranged on the side of the rectangular base plate, along which side the control input circuits are arranged, the control input terminals being connected with the respective control input circuits via a wiring board.

The above object is also achieved by a driving circuit module which comprises: a driving circuit device having a main circuit including power semiconductor elements connected in a bridge circuit connected between a pair of power supply points; control input circuits for controlling the respective semiconductor elements; a square base plate; chips of the semiconductor elements aligned in two rows along a first pair of the opposed facing sides of the square base plate; chips of the control input circuits aligned in two rows along the first pair of the sides of the square base plate; input and output terminals of the main circuit arranged on a second pair of the opposed facing sides of the square base plate, the input and output terminals being connected with the corresponding semiconductor elements via conductors; and control input terminals arranged on the first pair of the sides of the square base plate, the control input terminals being connected with the control input circuits via wiring boards.

It is preferable to mount the chips of the control input circuits on exclusive electrode plates disposed on the base plate separately from chips of the semiconductor elements, and connect the control input circuits with the corresponding semiconductor elements.

It is preferable for avoiding complicated wiring between the input and output terminals of the main circuit and the semiconductor elements to arrange the semiconductor elements constituting the upper arm of the main circuit in the first area, and the semiconductor elements constituting the under arm of the main circuit in the second area separated from the first area.

It is preferable for facilitating the mount of the semiconductor elements to dispose the first common electrode plate;

first individual electrode plates; the second common electrode plate; and second individual electrode plates, arrange the semiconductor elements constituting the upper arm of the main circuit on the first common electrode plate, connect the upper arm semiconductor elements with the respective first individual electrode plates, arrange the semiconductor elements constituting the under arm of the main circuit on the respective second individual electrode plates, and connect the under arm semiconductor elements with the second common electrode plate.

It is preferable to connect one of the input terminals corresponding to the power supply points with the first common electrode plate; the other input terminal with the second common electrode plate; and the output terminals in common with the respective first individual electrode plates and the respective second individual electrode plates.

It is preferable to form the input terminals and the output terminals in the end of the respective conductors for connecting the input terminals and the output terminal with the corresponding electrode plates.

The control input terminals preferably include power supply terminals led out from the control input circuits for facilitating various applications of the module.

It is preferable to fit a case to the base plate, the case being shaped with a frame having a window corresponding to the mounting area of the base plate, in which the semiconductor elements and the control input terminals are mounted. And, it is preferable for obtaining a solid and unitary module to inject a liquid resin between the case and the base plate, and harden the liquid resin.

The present invention provides an intelligent driving circuit module by adopting following measures. Each of the semiconductor elements constituting the bridge circuit of the driving circuit is provided with an exclusive control input circuit which directly controls the pairing semiconductor element exclusively. The control input circuits are mounted in the vicinity of the pairing semiconductor elements. The control input circuits are arranged in the periphery of the mounting area of the base plate, and the control input terminals are arranged in the periphery of the base plate and in the vicinity of the corresponding control input circuits so that a small wiring board may be used which connects the control input terminals and the control input circuits via the shortest path. Thus, the dimensions of the module are reduced by the adoption of the small wiring board. And, the cost of the module is reduced by eliminating the conventional capacitor for compensating the wiring inductance by virtue of the shortened wiring length.

Briefly stated, the chips of the semiconductor elements are mounted along the long side of the rectangular base plate of one embodiment. The chips of the control input circuits are displaced from the semiconductor elements along the short sides of the base plate and mounted along another long side of the base plate. And, the control input terminals are arranged on the side of the base plate along which the control input circuits are mounted. In another embodiment, the chips of the semiconductor elements and the control input circuits are divided and mounted along a pair of sides of the square base plate opposed facing to one another. The control input circuits are displaced toward the peripheral side of the mounting area of the base plate from the corresponding semiconductor elements. And, the control input terminals are also divided and arranged on the side of the base plate along which the corresponding control input circuits are arranged. In the embodiments, the control input circuits are connected with the control input terminals via a wiring board or wiring boards.

In one embodiment, the input and output terminals of the main circuit are arranged on the long side of the base plate along which the semiconductor elements are mounted. In another embodiment, the input and output terminals of the main circuit are arranged on a pair of sides of the square base plate opposed facing to one another and extending perpendicularly to the sides along which the semiconductor elements are mounted. In the embodiments, the input and output terminals are connected easily with the semiconductor elements via conductors extending above the chip mounting area of the base plate without crossing the other conductors.

By the above described configurations of the present invention, the input and output terminals, the wiring board or the wiring boards, and control input terminals are arranged by effectively utilizing the peripheral space of the chip mounting area of the base plate. An embodiment of the present invention may reduce the module area to its minimum by arranging the input and output terminals, the wiring boards, and control input terminals on the long side of the rectangular base plate. Another embodiment of the present invention may reduce the module area to its minimum by distributing the input and output terminals, the wiring boards, and control input terminals to the four sides of the square base plate. The control input circuit as the key element of the present intelligent driving circuit module may be integrated into a small chip much smaller than the semiconductor element chip. So, the chip mounting area of the module may increase by 10% at most even when the control function is distributed to a plurality of control input circuits disposed corresponding to the semiconductor elements.

BRIEF DESCRIPTION OF THE DRAWINGS

FIG. 2(a) is a top plan view showing the mounted state of the chips of the second embodiment of the present invention;

FIG. 2(b) is a top plan view showing the terminal arrangement and connections of the second embodiment of the present invention;

FIG. 2(c) is a top plan view showing the module mounted inside the case of the second embodiment of the present invention.

DETAILED DESCRIPTION OF PREFERRED EMBODIMENTS

Figure 1A:
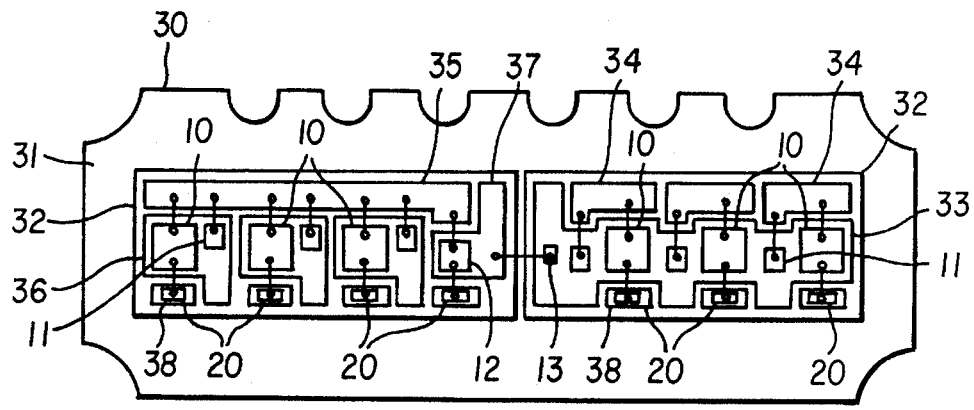
FIG. 1(a) is a top plan view showing the mounted state of the chips of the first embodiment of the present invention.
Figure 1B:
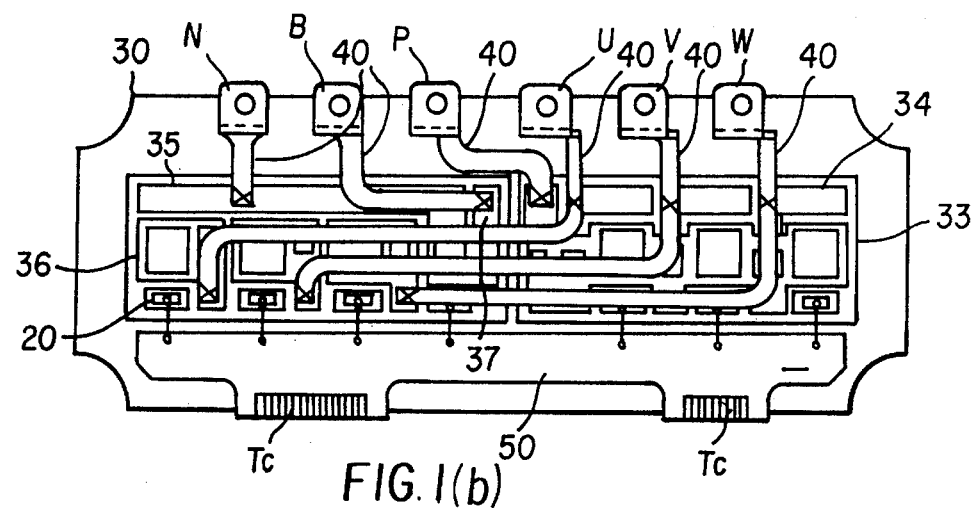
FIG. 1(b) is a top plan view showing the terminal arrangement and connections of the first embodiment of the present invention.
Figure 1C:
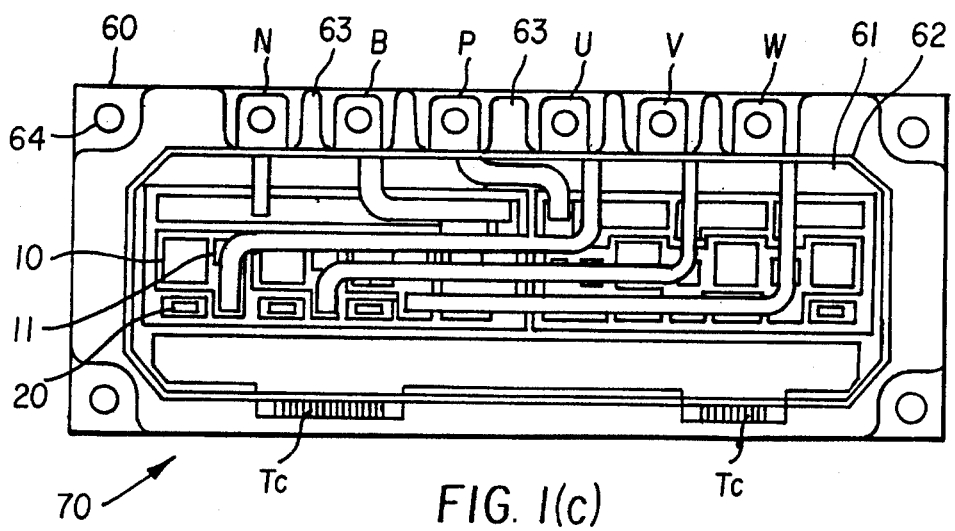
FIG. 1(c) is a top plan view showing the module mounted inside the case of the first embodiment of the present invention.
Figure 3:
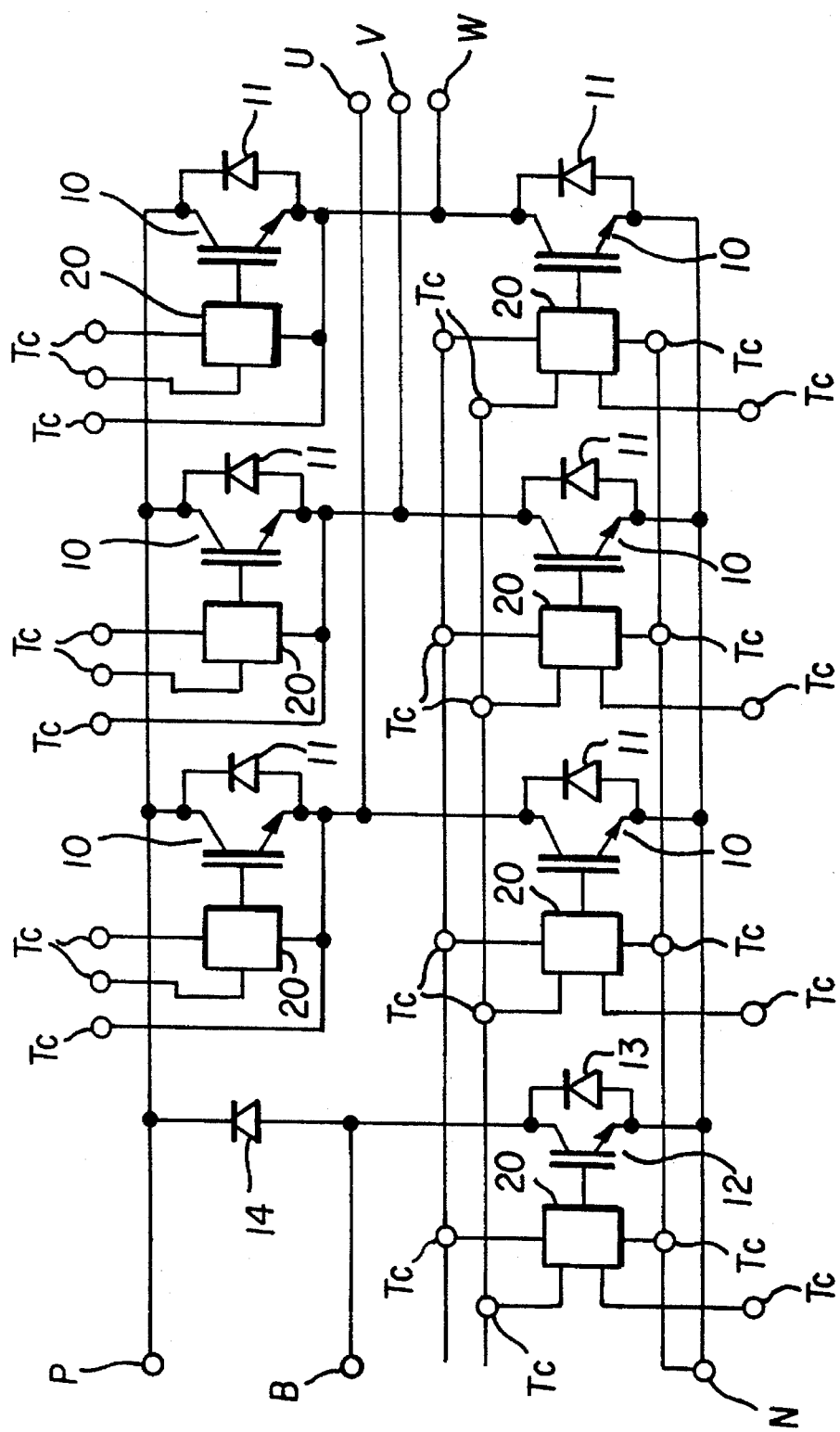
FIG. 3 is a circuit diagram showing the driving circuit having a bridge connection and mounted on the module of the first embodiment or the second embodiment.

Now, the present invention will be explained hereinafter with accompanied drawings which illustrate the preferred embodiments of the present invention. FIG. 1(a), 1(b) and 1(c) show top plan views of the first embodiment of the present invention. FIGS. 2(a), 2(b) and 2(c) show top plan views of the second embodiment of the present invention. And, FIG. 3 is a circuit diagram showing a driving circuit with a bridge connection incorporated in the first and second embodiments. At first, explanation will be made with reference to FIG. 3 to facilitate understanding the first and second embodiments.

FIG. 3 shows a three-phase bridge circuit corresponding to a driving circuit of an inverter for driving a three-phase motor. The circuit of FIG. 3 includes a braking circuit for absorbing the energy stored in the inductance on the side of the load such as a motor. A semiconductor element 10 constituting the bridge of FIG. 3 is an insulated gate bipolar transistor. As usual, an upper arm semiconductor element 10 is connected in series with a pairing under arm semiconductor element 10. Three pairs of the upper and under arm semiconductor elements are connected in parallel between a positive input terminal P and a negative input terminal N of a DC power supply. Three output terminals U, V, and W are lead out individually from the connection points of the upper and under arms. A free wheeling diode 11 is connected in reverse parallel with each semiconductor element 10. A collector of the upper arm semiconductor element 10 is connected with the positive input terminal P. An emitter of the under arm semiconductor element 10 is connected with the negative input terminal N.

The present invention connects a control input circuit 20 shown by a rectangular block to a gate of each semiconductor element 10. The control input circuit 20 includes a gate driving circuit which directly drives the semiconductor element 10. A pair of power supply terminals Tc and a control signal terminal Tc are led out from the control input circuit 20 located on the upper arm. A pair of power supply terminals Tc and two control signal terminals Tc are led out from the control input circuit 20 located on the upper arm. For increasing the freedom of the driving circuit module for various applications, three control input terminals Tc are independently led out from the upper arm control input circuit 20, and four control input terminals Tc are independently led out from the under arm control input circuit 20 in FIG. 3. As shown in the figure, connections are made to the power supply terminals Tc independently led out of the control input circuit 20 outside the module as shown by the fine lines in the figure except that the negative power supply terminal of the control input circuit 20 located on the side of the upper arm is connected inside the module with the emitter of the corresponding semiconductor element 10.

A semiconductor element 12 with a small capacity shown on the left hand side of the FIG. 3 is disposed for braking as described earlier. A diode 13 is connected in reverse parallel with the semiconductor element 12. An emitter of the semiconductor element 12 is connected with the negative input terminal N. A braking terminal B is led out from a collector of the semiconductor element 12. The semiconductor element 12 is provided with a control input circuit 20 having four control input terminals Tc. When the semiconductor element 12 is turned on by the gate control of the corresponding control input circuit 20, a current flows through a braking resistor (not shown) connected between the positive input terminal P and the braking terminal B. In association with this current flow, the stored energy is absorbed from the load side via the diodes 11 of the bridge circuit. A diode 14 is fixed between the terminals P and B for free wheeling when a reverse current is caused during the baking operation.

Referring now to FIGS. 1(*a*), 1(*b*) and 1(*c*), FIG. 1(*a*) shows the mounted state of the chips. FIG. 1(*b*) shows the terminal connections, and FIG. 1(*c*) the module mounted inside a case. As shown in FIG. 1(*a*), a base 30 is formed with a rectangular shape. Semicircular cut-outs are formed on a long side of the base 30 for accepting the input and output terminals. Quarter-circular cut-outs are formed at the four corners of the base 30 for fixing the module. The base 30 includes a thick metal plate made of Cu, for example, which has high thermal conductivity. In FIG. 1(*a*), two rectangular ceramic insulator plates 32 are arranged side by side with their long sides aligned in the central part of the base 30, and fixed tightly with the base 30 by brazing or by soldering. The insulator plate 32 is made of alumina, for example. And, metal electrode plates with various shapes are arranged in the predetermined locations on the insulator plate 32. The metal electrode plates are made of Cu, for example, which has high electrical conductivity. The metal electrode plates are fixed to the insulator plate 32 by the similar methods with their upper faces positioned on the same level.

The insulator plate 32 shown on the right hand side of the figure mounts the upper arm of the bridge circuit. In more detail, this insulator plate 32 mounts three semiconductor elements 10, three diodes 11, a common electrode plate 33 common to the semiconductor elements 10 and the diodes 11, and three individual electrode plates 34. The insulator plate 32 shown on the left hand side of the figure mounts the under arm of the bridge circuit. The under arm insulator plate 32 mounts a common electrode plate 35 and three individual electrode plates 36. In addition, the under arm insulator plate 32 mounts another electrode plate 37 for the braking semiconductor elements 12, and electrode plates 38 for four control input circuits 20 including the one for braking.

According to the present invention, it is preferable to mount the chips of the semiconductor elements and the respective control input circuits in close proximity. Specifically, the semiconductor elements 10 are aligned along the long side of the base 30, and the corresponding control input circuits 20 are displaced along the short side of the base 30 and located below the corresponding semiconductor elements 10 in the first embodiment as shown in FIG. 1(*a*).

Due to this arrangement, three semiconductor elements 10 of the upper arm are aligned in the lateral direction of FIG. 1(*a*), and soldered to the common electrode plate 33. Since the semiconductor element 10 is a vertical power semiconductor element having its collector on the back surface of the chip, the collector is connected with the common electrode plate 33 at the same time when the semiconductor element 10 is mounted on the common electrode plate 33. Therefore, the mount of the semiconductor element 10 is completed by connecting the emitter with the individual electrode plate 34, and the gate with the control input circuit 20 by wire bonding. It is preferable to mount the diodes 11 in the neighborhood of the corresponding semiconductor elements 10. The diodes 11 are connected with the respective individual electrode plates 34 by wire bonding after the diodes 11 are mounted on and fixed to the common electrode plate 33. It is preferable to insert the electrode plates 38 for the control input circuits 20 in the recesses formed in the periphery of the common electrode 33. An integrated circuit of the control input circuit 20 may be incorporated into the chip of the semiconductor element 10, since the semiconductor element 10, though for the power application, very often has repeated fine unit structures built in by the techniques of manufacturing the highly integrated circuits.

Three semiconductor elements 10 of the under arm are aligned along the long side of the base 30, and the respective diodes 11 are disposed in the neighborhood of the corresponding semiconductor element. On the under arm side, the chips of each semiconductor element 10 and the pairing diode 11 are mounted on the individual electrode 36, and are connected with the common electrode plate 35 by wire bonding. The braking semiconductor element 12 is mounted on the electrode plate 37 and bonded to the common electrode plate 35. The diode 13 which the semiconductor element 12 accompanies is mounted on the common electrode plate 33 on the upper arm side and connected with the electrode plate 37 on the under arm side by wire bonding.

On the under arm side too, the control input circuits 20 are mounted on the respective electrode plates 38 disposed immediately below the individual electrode plate 36 or 37 so that the control input circuits 20 may be positioned in the closest proximity to the corresponding semiconductor elements 10 and 12. The control input circuits 20 are connected with the corresponding semiconductor elements 10 and 12 by wire bonding. The upper arm common electrode plate 33 and the under arm individual electrode plates 36 on which the chips are mounted may be arranged in the vertical center of the insulator plates 32. The electrode plates 38 for mounting the chips of the control input circuits 20 may be arranged in the lower part of the insulator plates 32, and the upper arm individual electrode plates 34 and the under arm common electrode plate 35 not for mounting the chips may be arranged in the upper part of the insulator plates 32. By this arrangement, the chip mounting area of the base 30 can be confined in a small area without leaving any unused area.

Referring now to FIG. 1(b), FIG. 1(b) shows the terminals of the module led out from the chip mounting area. The input and output terminals of the main circuit of the first embodiment are aligned as shown in the figure on the long side of the base 30 opposed facing to the long side near which the control input circuits 20 are arranged. It is preferable for leading out the terminal to use a Cu conductor 40, one end of which is formed the terminal. The conductor 40 is connected with a predetermined electrode plate located in the chip mounting area by soldering. In more detail, the conductors 40 for the input terminals P and N are connected with the common electrode plates 33 and 35, respectively, at the positions indicated by x symbols. The conductor 40 for the braking terminal B is connected with the electrode plate 37 located on the under arm side. Each of the output terminals U, V, and W is connected via a conductor 40 with the corresponding individual electrode plate 34 on the upper arm side and the corresponding individual electrode plate 36 on the under arm side. Thus, the input and output terminals of the main circuit are connected by effectively using the spaces on and above the chip mounting area.

In the first embodiment, the control input terminals Tc are aligned on the long side of the base 30 on the side on which the control input circuits 20 are arranged. The control input terminals Tc are connected with the control input circuits 20 via a wiring board 50. In practice, it is preferable to dispose the control input terminals Tc in a part of the wiring board 50 as shown in FIG. 1(b). Since all the control input circuits 20 are aligned, the control input circuits 20 are connected easily with the control input terminals Tc via the wiring board 50 and bonding wires. Since the control input circuits 20 and the control input terminals Tc are arranged on the same side of the base 30, the wiring board 50 may be small, and its internal wiring conductor length may be short. In the illustrated example, the control input terminals Tc are divided into two groups for the upper arm and the under arm so as to shorten the wiring conductor length of the wiring board 50 as much as possible. If necessary, an integrated circuit for controlling the entire driving circuit device in addition to the control by the control input circuits 20 may be mounted on the wiring board 50.

Referring now to FIG. 1(c), FIG. 1(c) shows an almost completed module 70 in which the base 30 is fitted to a case 60. The case 60 is a molded resin frame which has a window 61 corresponding almost to the chip mounting area of the base 30. The case 60 has also a sheath 62 which surrounds the window 61. Separation walls 63 protrude from the sheath 62 for separating the input and output terminals from each other. Fixing holes 64 are disposed in the four corners of the case 60. Since recesses are disposed on the back side of the case 60 so that the case 60 may fit in with the outline of the base 30, the case 60 and the base 30 can be assembled as shown in the figure simply by fitting the case 60 and the base 30 to one another. Though FIG. 1(b) was explained prior to FIG. 1(c) for the sake of clearer understanding, it is preferable to fit the case 60 to the base 30 of FIG. 1(a), and to complete the assembly as shown in FIG. 1(c) by arranging the terminals and connecting them as explained with reference to FIG. 1(b). Finally, the very solid driving circuit module 70 is obtained by injecting a liquid resin to the case 60 from the window 61 and hardening the liquid resin.

FIGS. 2(a), 2(b) and 2(c) show top plan views of the second embodiment of the present invention. In FIGS. 2(a), 2(b) and 2(c), the same parts with those of FIGS. 1(a), 1(b) and 1(c) are designated with same reference numerals or symbols and their duplicated explanation will be omitted. Referring now to FIG. 2(a), a base 30 of the second embodiment has an almost square main body 31. An almost square insulator plate 32 formed corresponding to the square main body 31 is bonded with the square main body 31 of the base 30. Chips of semiconductor elements 10 are mounted in two rows extending in parallel with a pair of opposed facing sides of the base 30 as shown in the figure. Control input circuits 20 are arranged on the upper side or the lower side of the corresponding semiconductor elements 10.

The top half of the insulator plate 32 corresponds to the upper arm side, and the bottom half the under arm side. Chips of three semiconductor elements and annexed diodes 11 are mounted on a common electrode plate 33 on the upper arm side. Chips of three semiconductor elements and annexed diodes 11 are mounted on respective individual electrode plates 36 on the under arm side. Individual electrode plates 34 of the upper arm side and a common electrode plates 35 of the under arm side are arranged between the common electrode plate 33 and the individual electrode plates 36. The semiconductor elements 10 of the upper arm are connected with the respective individual electrode plates 34 by wire bonding, and the semiconductor elements 10 of the under arm with the common electrode plate 35 by wire bonding. A long electrode plate 37 is arranged along the left side of the insulator plate 32. A semiconductor element 12 for braking is mounted on the bottom end of the electrode plate 37, and connected with the electrode plate 35 by wire bonding. A diode 13 annexed to the semiconductor element 12 is mounted on the left end of the common electrode plate 33, and connected with the central part of the electrode plate 37 by wire bonding. Control input circuits 20 of the upper arm are mounted on respective individual electrode plates 38 arranged immediately above the common electrode plate 33 and connected with the corresponding semiconductor elements 10 by wire bonding. And, control input circuits 20 of the under arm are mounted on individual electrode plates 38 arranged immediately below the individual electrode plates 36 and the electrode plate 37, and connected with the corresponding semiconductor elements 10 and 12 by wire bonding.

As shown in FIG. 2(b), input terminals P and N of the main circuit are arranged perpendicularly to the alignment of the semiconductor elements 10 of the upper and under arms on the left side of the base 30. Output terminals U, V and W of the main circuit are arranged perpendicularly to the alignment of the semiconductor elements 10 in the upper and under arms on the right side of the base 30. A braking terminal B is aligned with the input terminals P and N. Control input terminals Tc are divided and arranged on a pair of sides of the base 30 extending in parallel with the alignment of the semiconductor elements 10. Since the connection of the input and output terminals with the chip mounting area via conductors 40 is done in the similar manner as in the first embodiment, its explanation is omitted. Two wiring boards 50 are used in the second embodiment for mounting the control input terminals Tc. One of the wiring boards 50 is arranged in the upper part of the base 30, and the other one in the lower part of the base 30. The control input terminals Tc are constructed as a part of the wiring boards 50. The wiring boards 50 are small enough to shorten the internal wiring length as in the first embodiment. Since the as assembled module shown in FIG. 2(c) is almost same with that shown in FIG. 1(c) except the module is square in the second embodiment, the explanation referring to FIG. 2(c) is omitted. The second embodiment is more preferable to the first embodiment, since the module 70 is shaped with a square which facilitates further reducing the size of the module in comparison with the rectangular module of the first embodiment.

Though the embodiments of the present invention have been explained by way of the insulated gate bipolar transistor as the semiconductor element 10, it is obvious that the present invention is applicable to the driving circuit devices having bipolar transistors, field effect transistors, etc. It is also obvious that the present invention is applicable to driving circuit devices having a two-phase bridge circuit configuration.

As explained above, the present invention has adopted to the driving circuit device, having a bridge connection, a circuit configuration which provides each power semiconductor element with a control input circuit. In the first embodiment, the chips of the semiconductor elements are mounted along the long side of the rectangular base plate. The chips of the control input circuits are displaced from the semiconductor elements along the short sides of the base plate and mounted along the long side of the base plate. The input and output terminals of the main circuit are arranged on the side of the base plate along which the semiconductor elements are mounted. And, the control input terminals are arranged on the side of the base plate along which the control input circuits are mounted.

In the second embodiment, the chips of the semiconductor elements and the control input circuits are divided and mounted along a pair of the sides of the square base plate opposed facing to one another. The control input circuits are mounted on the peripheral side of the corresponding semiconductor elements. The control input terminals are also divided and arranged on the side along the control input circuits are arranged. The input and output terminals of the main circuit are arranged on the other pair of the sides of the square base plate opposed facing to one another. The input and output terminals are connected with the semiconductor elements via conductors. And, the control input circuits are connected with the control input terminals via wiring boards.

The present invention that adopts the above described module provides the shows following advantages.

The chips of the control input circuits are mounted on the periphery of the chip mounting area of the base, and the control input terminals are arranged in the periphery of the base in close proximity to the corresponding control input circuits. Thus, the control signal wiring between the control input circuits and their respective terminals is shortened to a length short enough to eliminate the conventional capacitor for compensating the wiring inductance. This makes it possible to adopt a small wiring board for the control signal wiring. As a result, the cost and the size of the module are reduced.

The control input circuit with small chip size is enough only to directly control the corresponding power semiconductor element. And the control input circuits are located in close proximity to the pairing semiconductor elements. Thus, the increase of the chip mount area by the incorporation of the control function is small. Since the control input circuits and the corresponding semiconductor elements are connected via short bonding wires, noise is prevented from entering form the input side of the semiconductor elements and the module is prevented from malfunction.

By arranging the semiconductor elements constituting the upper arm and the under arm in the predetermined order, the cross wiring of the conductors is prevented between the semiconductor elements and the input and output terminals of the main circuit. Thus, the chip mounting area of the base is utilized effectively and easy arrangement of the constituent elements is facilitated.

The chip mounting area is further reduced by disposing two sets of the common electrode plate and the individual electrode plates, one set for the upper arm semiconductor elements and another set for the under arm semiconductor elements respectively, by arranging the upper arm semiconductor elements on the common electrode plate and connecting the upper arm semiconductor elements with the respective individual electrode plates, and by arranging the under arm semiconductor elements on the respective individual electrode plates and connecting the under arm semiconductor elements with the common electrode plate.

Manufacturing of the chips of the integrated control input circuit is facilitated by separating the semiconductor element chips from the control input circuit chips, and by mounting the control input circuit chips on the electrode plates separately from the semiconductor element chips.

And, the application freedom of the driving circuit module is widened by including the power supply terminals led out from each control input terminals in the control input terminals.

What is claimed is:

1. A driving circuit module comprising:

a driving circuit device having a main circuit including power semiconductor elements connected in a bridge circuit, said bridge circuit being connected between a pair of power supply points comprised of first and second input terminals, said semiconductor elements including semiconductor chips and said main circuit further including output terminals;

control input circuits including control input terminals and control chips for controlling the respective semiconductor elements; and a rectangular base plate having a length direction and a width direction; wherein the semiconductor chips are aligned along the length direction of the rectangular base plate;

the control chips are aligned along the length direction of the rectangular base plate and are displaced along the width direction of the rectangular base plate from corresponding semiconductor chips;

the input and output terminals of the main circuit are arranged on a first long side of the rectangular base plate along which the semiconductor chips are arranged, the input and output terminals being connected with the corresponding semiconductor elements via respective conductors; and the control input terminals are arranged on a second long side of the rectangular base plate along which the control chips are arranged, the control input terminals being connected with the respective control input circuits via a wiring board.

2. A driving circuit module comprising:

a driving circuit device having a main circuit including power semiconductor elements connected in a circuit, said bridge circuit being connected between a pair of power supply points comprised of first and second input terminals, said semiconductor elements including semiconductor chips and said main circuit further including output terminals;

control input circuits including control input terminals and control chips for controlling the respective semiconductor elements; and a square base plate; wherein the semiconductor chips are aligned in two rows along a first pair of the opposed facing sides of the square base plate;

the control chips are aligned in two rows along the first pair of the sides of the square base plate;

the input and output terminals of the main circuit are arranged on a second pair of the opposed facing sides of the square base plate, the input and output terminals being connected with the corresponding semiconductor elements via conductors; and the control input terminals are arranged on the first pair of the sides of the square base plate, the control input terminals being connected with the respective control input circuits via wiring boards.

3. The driving circuit module according to claim 1, wherein the main circuit includes an upper arm and an under arm, semiconductor elements constituting the upper arm of the main circuit are arranged in a first area, and semiconductor elements constituting the under arm of the main circuit are arranged in a second area, the first area and the second area being separated from one another.

4. The driving circuit module according to claim 2, wherein the main circuit includes an upper arm and an under arm, semiconductor elements constituting the upper arm of the main circuit are arranged in a first area, and semiconductor elements constituting the under arm of the main circuit are arranged in a second area, the first area and the second area being separated from one another.

5. The driving circuit module according to claim 3, further comprising: a first common electrode plate; first individual electrode plates; a second common electrode plate; and second individual electrode plates, the semiconductor elements constituting the upper arm of the main circuit being arranged on the first common electrode plate and connected with the respective first individual electrode plates, and the semiconductor elements constituting the under arm of the main circuit being arranged on the respective second individual electrode plates and connected with the second common electrode plate.

6. The driving circuit module according to claim 4, further comprising: a first common electrode plate; first individual electrode plates; a second common electrode plate; and second individual electrode plates, the semiconductor elements constituting the upper arm of the main circuit being arranged on the first common electrode plate and connected with the respective first individual electrode plates, and the semiconductor elements constituting the under arm of the main circuit being arranged on the respective second individual electrode plates and connected with the second common electrode plate.

7. The driving circuit module according to claim 5, wherein the first input terminal is connected with the first common electrode plate; the second input terminal is connected with the second common electrode plate; and the output terminals are connected in common with the respective first individual electrode plates and the respective second individual electrode plates.

8. The driving circuit module according to claim 6, wherein the first input terminal is connected with the first common electrode plate; the second input terminal is connected with the second common electrode plate; and the output terminals are connected in common with the respective first individual electrode plates and the respective second individual electrode plates.

9. The driving circuit module according to claim 1, wherein the control chips are mounted on exclusive electrode plates disposed on the base plate separately from the semiconductor chips, and the control input circuits are connected with the corresponding semiconductor elements.

10. The driving circuit module according to claim 2, wherein the control chips are mounted on exclusive electrode plates disposed on the base plate separately from the semiconductor chips, and the control input circuits are connected with the corresponding semiconductor elements.

11. The driving circuit module according to claim 1, wherein the control input terminals include power supply terminals led out from the control input circuits.

12. The driving circuit module according to claim 2, wherein the control input terminals include power supply terminals led out from the control input circuits.

13. The driving circuit module according to claim 1, further comprising a case fitted to the base plate, the case being shaped with a frame having a window corresponding to a mounting area of the base plate, the semiconductor elements and the control input circuits being mounted therein.

14. The driving circuit module according to claim 2, further comprising a case fitted to the base plate, the case being shaped with a frame having a window corresponding to a mounting area of the base plate, the semiconductor elements and the control input circuits being mounted therein.

* * * * *